US009232160B2

(12) United States Patent
Ikuma et al.

(10) Patent No.: US 9,232,160 B2
(45) Date of Patent: Jan. 5, 2016

(54) VOLTAGE GENERATION CIRCUIT, ANALOG-TO-DIGITAL CONVERSION CIRCUIT, SOLID-STATE IMAGING DEVICE, AND IMAGING APPARATUS, WHICH ARE CAPABLE OF REDUCING RANDOM NOISE

(71) Applicant: PANASONIC CORPORATION, Osaka (JP)

(72) Inventors: Makoto Ikuma, Kyoto (JP); Hiroshi Fujinaka, Osaka (JP); Masahiro Higuchi, Hyogo (JP); Yuusuke Yamaoka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 147 days.

(21) Appl. No.: 14/053,473

(22) Filed: Oct. 14, 2013

(65) Prior Publication Data

US 2014/0034812 A1    Feb. 6, 2014

Related U.S. Application Data

(63) Continuation of application No. PCT/JP2012/002756, filed on Apr. 20, 2012.

(30) Foreign Application Priority Data

Apr. 21, 2011    (JP) ................................. 2011-094598

(51) Int. Cl.
*H04N 5/357* (2011.01)
*H04N 5/3745* (2011.01)
(Continued)

(52) U.S. Cl.
CPC ............... *H04N 5/357* (2013.01); *H03M 1/186* (2013.01); *H04N 5/3577* (2013.01); *H04N 5/378* (2013.01); *H04N 5/3745* (2013.01); *H03M 1/123* (2013.01); *H03M 1/765* (2013.01)

(58) Field of Classification Search
CPC ...... H04N 5/357; H04N 5/3745; H04N 5/378
USPC ................. 250/214 R, 214.1, 208.1, 214 RC, 250/214 SW; 327/514, 515, 530–540, 327/308–326, 131, 132
See application file for complete search history.

(56) References Cited

U.S. PATENT DOCUMENTS 5,444,785 A * 8/1995 Izawa et al. ..................... 381/63
6,339,356 B1 * 1/2002 Daughtry et al. ............. 327/308

(Continued)

FOREIGN PATENT DOCUMENTS

JP    3-98523 U     10/1991
JP    11-168383 A    6/1999

(Continued)

OTHER PUBLICATIONS

International Search Report issued in PCT/JP2012/002756, dated May 29, 2012, with English translation.

*Primary Examiner* — Que T Le
(74) *Attorney, Agent, or Firm* — McDermott Will & Emery LLP

(57) ABSTRACT

A voltage generation circuit includes a control circuit which outputs a first digital signal, a DAC which outputs a first analog signal corresponding to the first digital signal, and an attenuator which is connected to an output terminal of the DAC and is configured to output a voltage signal obtained by attenuating the first analog signal input from the DAC.

17 Claims, 10 Drawing Sheets

(51) Int. Cl.
 *H04N 5/378* (2011.01)
 *H03M 1/18* (2006.01)
 *H03M 1/12* (2006.01)
 *H03M 1/76* (2006.01)

(56) References Cited

U.S. PATENT DOCUMENTS

| | | | |
|---|---|---|---|
| 6,956,413 B2 * | 10/2005 | Bailey | 327/131 |
| 7,271,755 B2 * | 9/2007 | Mulder et al. | 341/154 |
| 7,710,181 B2 * | 5/2010 | Nakatani et al. | 327/308 |
| 2003/0071666 A1 | 4/2003 | Bailey | |
| 2005/0030270 A1 | 2/2005 | Miyata et al. | |
| 2008/0111591 A1 | 5/2008 | Mori | |

FOREIGN PATENT DOCUMENTS

| | | |
|---|---|---|
| JP | H11-168383 A | 6/1999 |
| JP | 2005-057484 A | 3/2005 |
| JP | 2008-124726 A | 5/2008 |

* cited by examiner $Vtop = Iref \times Rtot$
$\phantom{Vtop} = (Iconst \times Gain1) \times Rtot$
$\phantom{Vtop} = Vconst \times Gain1$
WHERE $Gain1 = Iref/Iconst$ AND
$Vconst = Iconst \times Rtot$

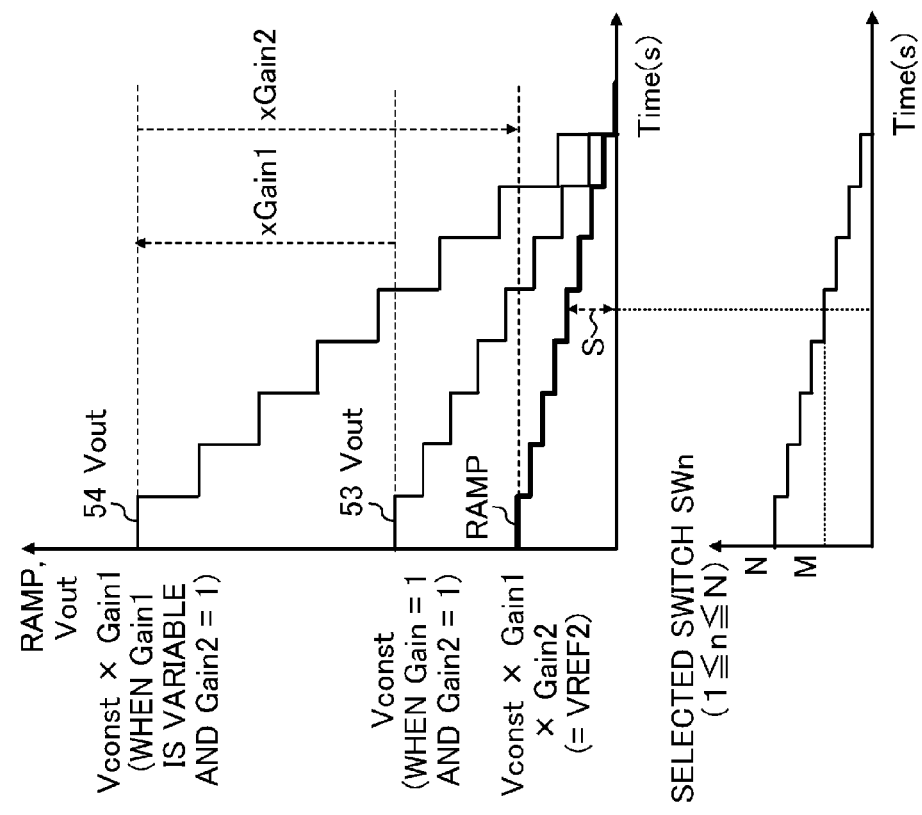
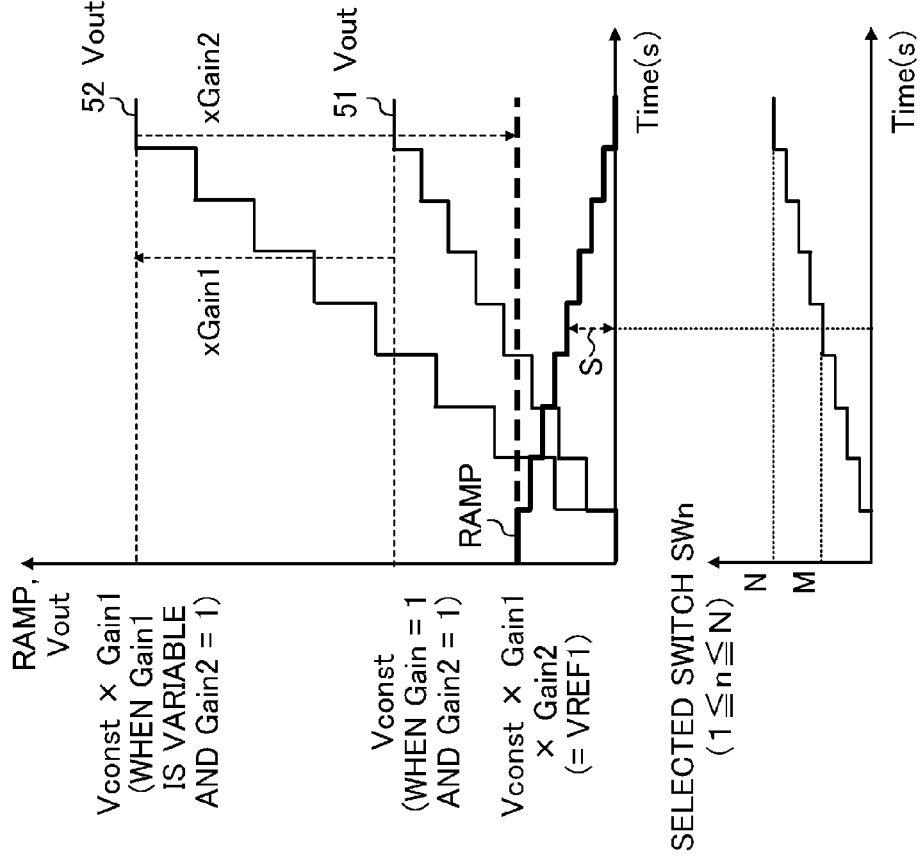
FIG.6A
FIG.6B

Gain2= Cin/ Cfbk

Gain2= Cin/( Cin +Coutk )

Vtop = Vconst × Gain1
     = (Iconst × Rtot) × Gain1
WHERE Gain1 = Vtop/Vconst
AND Vconst = Iconst × Rtot

VOLTAGE GENERATION CIRCUIT, ANALOG-TO-DIGITAL CONVERSION CIRCUIT, SOLID-STATE IMAGING DEVICE, AND IMAGING APPARATUS, WHICH ARE CAPABLE OF REDUCING RANDOM NOISE

CROSS-REFERENCE TO RELATED APPLICATIONS

This is a continuation of PCT International Application PCT/JP2012/002756 filed on Apr. 20, 2012, which claims priority to Japanese Patent Application No. 2011-094598 filed on Apr. 21, 2011. The disclosures of these applications including the specifications, the drawings, and the claims are hereby incorporated by reference in their entirety.

BACKGROUND

The technology described herein relates to voltage generation circuits, analog-to-digital conversion circuits, solid-state imaging devices, and imaging apparatuses.

Solid-state imaging devices having a resolution of as high as ten million pixels or more have been in practical use, and the cell size of a photoelectric conversion element has been increasingly reduced.

In order to achieve such a high-resolution solid-state imaging device, various techniques of reading a signal from a MOS image sensor have been proposed. In a conventional solid-state imaging device, for low noise and high speed, a pixel signal is detected by correlated double sampling (CDS) which uses a reset component and a data component (=the reset component+a signal component) which are digital signals obtained by analog-to-digital conversion using an A/D converter provided for each column.

In recent years, in addition to high resolution, the ability to perform high-speed shooting with high sensitivity has been demanded of solid-state imaging devices, and therefore, a further reduction in noise has been desired.

In general, noise occurring in solid-state imaging devices is roughly divided into two types, fixed pattern noise (FPN) and random noise. For FPN, since noise occurs in particular columns or pixels specific to each device, most of the noise can be removed by a correction technique which is optimized for each device using, for example, a digital signal processor (DSP) connected to an output of the solid-state imaging device.

On the other hand, random noise includes random noise which occurs mainly in the amplification transistors of pixels and randomly in the entire screen, and random horizontal noise which occurs mainly in an analog processing circuit provided in the vicinity of an imaging region. Since the noise level of random noise is not uniform, i.e., is random, it is difficult to correct the noise for each device.

In general, random noise is difficult to visually recognize, while random horizontal noise is easy to visually recognize. Therefore, specifically, random horizontal noise needs to be reduced to a level which is about 1/10 of the level of random noise occurring in the amplification transistor.

FIG. 10 is a circuit diagram showing a conventional voltage generation circuit 127 described in U.S. Pat. No. 6,956,413. The conventional voltage generation circuit 127 includes a DAC 127a and a control circuit 127b. The DAC 127a outputs a multi-level voltage reference signal RAMP using a ladder resistor circuit including ladder resistors R1-RN connected to a current varying circuit 127f, and switches SW0-SWN connected to taps between the ladder resistors. Note that Vtop shown in FIG. 10 indicates a top voltage of the ladder resistor circuit, and varies depending on a current value which varies depending on a signal CNG1. The control circuit 127b receives a signal CN4 and a clock signal CK0.

SUMMARY

As the resolution of a solid-state imaging device is increased, the size of a pixel is reduced and therefore a signal component (S: signal) read from a pixel decreases. Therefore, it is necessary to reduce a noise component (N: noise) in order to maintain the S/N ratio characteristics at the same level as before the pixel size reduction.

In a solid-state imaging device with a column-parallel-output A/D conversion configuration which includes the conventional voltage generation circuit 127 of FIG. 10, A/D conversion is performed by comparing the reference signal RAMP with a pixel signal (analog signal). However, it is difficult to reduce noise in the voltage generation circuit 127, which is a source of random horizontal noise, which is a characteristic of the column-parallel-output solid-state imaging device.

The conventional voltage generation circuit 127 includes the ladder resistors R1-RN which generate a plurality of reference voltages, and the switches SW0-SWN which correspond to the taps of the ladder resistors. When one of the switches SW0-SWN is turned on, one of the reference voltages is output as an output voltage. Thus, a multi-level output voltage is output.

However, in the voltage generation circuit 127, it is necessary to increase the number of reference voltages in order to increase the number of levels of the output voltage. To do so, it is necessary to increase the number of ladder resistors included in the ladder resistor circuit and the number of switches.

In general, in terms of noise reduction, the resistance value of the ladder resistor or the ON resistance value of the switch may be decreased. However, a reduction in the resistance value of the switch leads to a significant increase in chip area.

With the foregoing conventional problems in mind, the present disclosure describes implementations of a solid-state imaging device and an imaging apparatus in which noise can be reduced while an increase in area is reduced or prevented, and a voltage generation circuit which is used to embody the solid-state imaging device and the imaging apparatus.

A voltage generation circuit according to an example of the present disclosure includes a control circuit configured to output a first digital signal, a digital-to-analog conversion circuit configured to output a first analog signal corresponding to the first digital signal input from the control circuit, and an attenuator connected to an output terminal of the digital-to-analog conversion circuit, and configured to output a voltage signal obtained by attenuating the first analog signal input from the digital-to-analog conversion circuit.

With this configuration, a noise component, particularly a random horizontal noise component, which is contained in an output signal (first analog signal) of the digital-to-analog conversion circuit can be reduced by the attenuator. When the voltage generation circuit is used in a solid-state imaging device, only one attenuator may be provided for all column analog-to-digital conversion circuits. Therefore, the solid-stage imaging device can be configured using a relatively small number of elements, resulting in only a small increase in circuit area compared to the conventional art. Therefore, the above configuration allows for a reduction in random horizontal noise without a significant increase in circuit area. Therefore, a solid-state imaging device which has a small circuit area while providing a high-quality image can be provided. Note that the noise which can be attenuated by the attenuator includes thermal noise of a MOS transistor included in a switch, which is conventionally difficult to reduce without an increase in chip area.

When the control circuit controls the digital-to-analog conversion circuit so that, during a predetermined period of time, a voltage value of the voltage signal linearly decreases or increases in synchronization with a clock signal, then if the voltage signal is used as a reference signal in analog-to-digital conversion of a pixel signal etc., CDS can be easily performed.

The attenuator may be an active type attenuator including a differential amplifier or a passive type attenuator.

An analog-to-digital conversion circuit according to an example of the present disclosure is an analog-to-digital conversion circuit for converting a second analog signal into a second digital signal, including a voltage comparator configured to compare a voltage of the second analog signal with a voltage of the voltage signal output from the above voltage generation circuit, and a counter configured to perform counting-up or counting-down in synchronization with a clock signal, receive a result of comparison performed by the voltage comparator, and output, as the second digital signal, a count value occurring when the order of magnitude of the voltage signal and the second analog signal is reversed.

Thus, by combining the voltage generation circuit of the example of the present disclosure and this analog-to-digital conversion circuit, analog-to-digital conversion can be accurately performed without an increase in circuit area.

A solid-state imaging device according to an example of the present disclosure includes a pixel array including a plurality of unit pixels arranged in a matrix, a voltage generation circuit configured to output a reference signal, and column analog-to-digital conversion circuits provided, one for each row of the unit pixels or each group of several rows of the unit pixels, and configured to compare a voltage of an analog pixel signal read from the pixel array with a voltage of the reference signal to convert the pixel signal into a digital signal. The voltage generation circuit includes a control circuit configured to output a digital signal, a digital-to-analog conversion circuit configured to output an analog signal corresponding to the digital signal input from the control circuit, and an attenuator connected to an output terminal of the digital-to-analog conversion circuit, and configured to output, as the reference signal, a voltage signal obtained by attenuating the analog signal input from the digital-to-analog conversion circuit.

With this configuration, the reference signal whose noise component is reduced by the attenuator is supplied to the column analog-to-digital conversion circuit. Therefore, the accuracy of analog-to-digital conversion can be improved without an increase in circuit area, resulting in an image having high image quality and a high resolution.

Such a solid-state imaging device is preferably used in an imaging apparatus, such as a camera etc.

The voltage generation circuit of the example of the present disclosure and the solid-state imaging device including the voltage generation circuit can advantageously reduce noise characteristics while reducing the circuit area, and provide a captured image having a higher resolution.

BRIEF DESCRIPTION OF THE DRAWINGS

FIG. 6A is a diagram showing a reference signal which is obtained when an inverting attenuator is used in a current varying circuit according to the embodiment of the present disclosure.

FIG. 6B is a diagram showing a reference signal which is obtained when a non-inverting attenuator is used.

DETAILED DESCRIPTION

Embodiment

Figure 1:
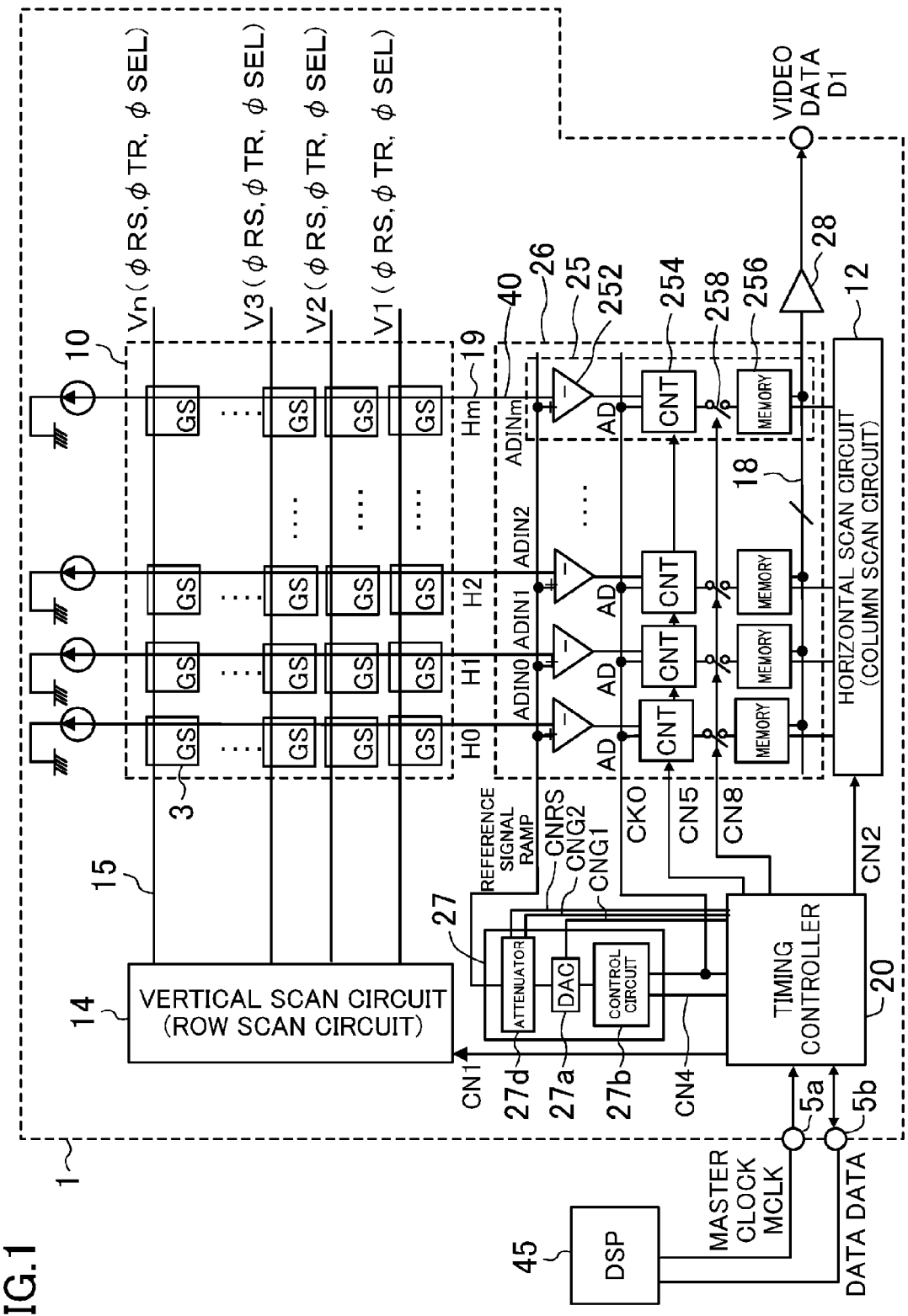
FIG. 1 is a circuit diagram showing an imaging apparatus (camera apparatus) according to an embodiment of the present disclosure.

FIG. 1 is a circuit diagram showing an imaging apparatus (camera apparatus) according to an embodiment of the present disclosure.

As shown in FIG. 1, the imaging apparatus of this embodiment includes a solid-state imaging device 1 and an external system (DSP) 45. The external system 45 supplies a master clock MCLK to a terminal 5a of the solid-state imaging device 1, receives and outputs data DATA which includes control signals, such as a horizontal synchronization signal, a vertical synchronization signal, a register control signal, etc., from and to a terminal 5b of the solid-state imaging device 1, and receives video data D1 which is a pixel signal.

The solid-state imaging device 1 includes a pixel array 10 including a plurality of unit pixels 3 arranged in rows and columns, a vertical scan circuit (row scan circuit) 14 which is provided outside the pixel array 10 and selects a unit pixel 3 which is to be read through a row scan line 15, column analog-to-digital conversion circuits (hereinafter referred to as "column A/D conversion circuits") 25 which are provided outside the pixel array 10, one for each column of unit pixels 3, vertical signal lines 19 which are connected to the respective corresponding columns of unit pixels 3, ADC input lines 40 which are connected to the respective corresponding vertical signal lines 19 and each of which transmits a signal read through the corresponding vertical signal line 19 to the corresponding column A/D conversion circuit 25, a voltage generation circuit 27 which outputs a reference signal RAMP to the column A/D conversion circuits 25, a timing controller 20 which generates various internal clocks based on the master clock MCLK supplied through the terminal 5a from the external system 45, a horizontal signal line 18 through which an A/D converted pixel signal is output from each column A/D conversion circuit 25, a horizontal scan circuit (column scan circuit) 12 which controls column addressing and column scanning, and an output circuit 28 which is connected to the horizontal signal line 18. The column A/D conversion circuits 25 constitute a column processor 26.

The timing controller 20 controls the vertical scan circuit 14 based on a control signal CN1, the horizontal scan circuit 12 based on a control signal CN2, and the voltage generation circuit 27 based on a control signal CN4. The timing controller 20 also outputs control signals CN5, CN8, CNG1, CNG2, and CNRS, a clock signal CK0, etc.

Although, in FIG. 1, the column A/D conversion circuits 25 are provided, one for each row of unit pixels 3, the column A/D conversion circuits 25 may be provided, one for each group of several rows.

Each column A/D conversion circuit 25 includes a voltage comparator 252 which has input terminals to which the reference signal RAMP and a pixel signal are respectively input, a counter 254 which receives the signal CK0 output from the timing controller 20 and an output signal of the voltage comparator 252, a data storage 256 which is connected to an output terminal of the counter 254, and a switch 258 which is provided between the counter 254 and the data storage 256. The counter 254 receives the signal CN5 output from the timing controller 20. The operation of the switch 258 is controlled based on the signal CN8 output from the timing controller 20.

The voltage generation circuit 27 of the embodiment of the present disclosure includes a control circuit 27b, a digital-to-analog conversion circuit (digital-to-analog converter (DAC)) 27a, and an attenuator 27d.

Figure 2:
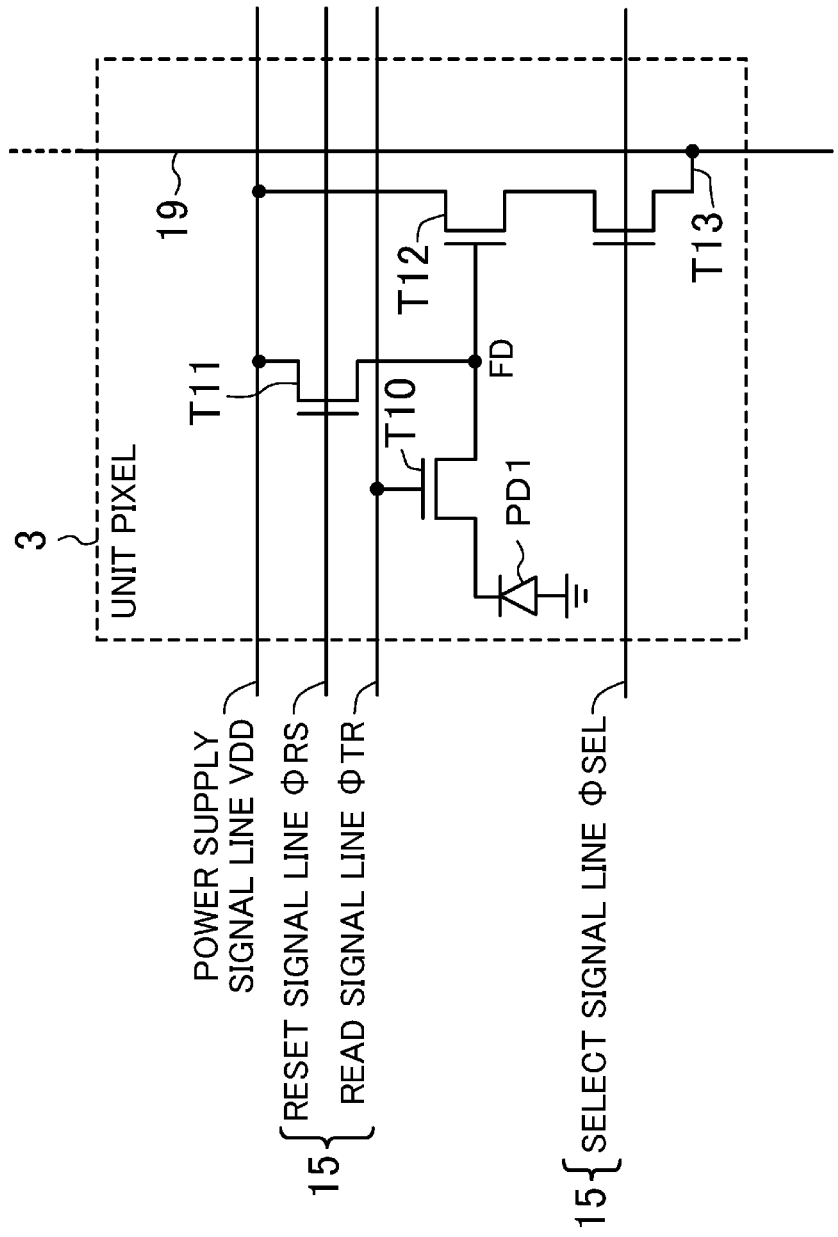
FIG. 2 is a circuit diagram showing a specific example configuration of a unit pixel.

FIG. 2 is a circuit diagram showing a specific example configuration of the unit pixel 3. Note that the row scan line 15 includes a reset signal line, a read signal line, and a select signal line.

As shown in FIG. 2, each unit pixel 3 includes a photodiode PD1 which performs photoelectric conversion, a read transistor T10 which is controlled based on a signal ΦTR applied through the read signal line to read a signal accumulated in the photodiode PD1, a floating diffusion FD which holds the signal read out by the read transistor T10, a reset transistor T11 which has two ends, one end connected to the floating diffusion FD and the other end connected to a power supply signal line VDD, and is controlled based on a signal ΦRS applied through the reset signal line, an amplification transistor T12 which has a gate electrode connected to the floating diffusion FD and outputs a voltage signal corresponding to charge accumulated in the floating diffusion FD, and a select transistor T13 which has a source connected to the source of the amplification transistor T12 and is controlled based on a signal ΦSEL applied through the select signal line. A voltage generated by the amplification transistor T12 is read as a pixel signal through the select transistor T13 to the vertical signal line 19.

Pixel signals, which are read from the unit pixels 3 on a row-by-row basis, are input through the vertical signal lines (H0-Hm) 19 and the ADC input lines (ADIN0-ADINm) 40 to the column A/D conversion circuit 25.

In the column A/D conversion circuit 25, the voltage comparator 252 compares the analog pixel signal with the reference signal RAMP generated by the voltage generation circuit 27, and the counter 254 measures, by counting, a time required for the voltage comparator 252 to complete the comparison process. The result of counting is stored in the data storage 256. The column A/D conversion circuit 25 has an n-bit A/D conversion function.

Each voltage comparator 252 has two input terminals: one is a non-inverting input terminal (hereinafter referred to as an "input terminal (+)"); and the other is an inverting input terminal (hereinafter referred to as an "input terminal (−)"). The same reference signal RAMP generated by the voltage generation circuit 27 is input to all the input terminals (+) of the voltage comparators 252. The input terminals (−) of the voltage comparators 252 are connected to the respective corresponding ADC input lines 40 (ADIN0-ADINm) to receive the respective corresponding pixel signals. The output signal of the voltage comparator 252 is supplied to the counter 254.

The column A/D conversion circuit 25 supplies the reference signal RAMP to the voltage comparator 252, and at the same time, starts counting using the clock signal. In this case, the voltage comparator 252 compares a voltage of the analog pixel signal input through the ADC input line 40 (ADIN0-ADINm) with a voltage (potential) of the reference signal RAMP, and outputs a pulse signal at a timing when the relative order of magnitude of the two voltages is reversed. The counter 254 outputs, as a digital value of the pixel signal, the count value which occurs when the counter 254 receives the pulse signal.

At this time, in addition to the A/D conversion, a process of calculating a difference between a reset component Vrst (containing noise) immediately after pixel resetting and a data component (the reset component Vrst+a signal component Vsig) containing the true signal component (depending on the amount of received light) is performed on the pixel signal (analog voltage) input through the ADC input line 40 (ADIN0-ADINm). As a result, only the true signal component Vsig can be extracted by removing variations, such as a clock skew, a counter delay, etc., in each row which cause an error in the column A/D conversion circuit 25. Thus, digital CDS can be performed.

Note that FIG. 1 shows an example configuration in which only the true signal component Vsig is extracted by performing counting-down on the reset component Vrst (containing noise) and counting-up on the data component (the reset component Vrst+the signal component Vsig).

The pixel signal digitized by the column A/D conversion circuit 25 is transmitted to the horizontal signal line 18 through a horizontal select switch (not shown) which is driven based on a horizontal select signal output from the horizontal scan circuit 12, and is then input to the output circuit 28.

With this configuration, in the solid-state imaging device of the embodiment of the present disclosure, the pixel array 10 including photodetectors as charge generators arranged in a matrix successively outputs pixel signals in each column on a row-by-row basis. A frame of image (i.e., a frame image) corresponding to the pixel array 10 including photodetectors arranged in a matrix is composed of pixel signals read from the entire pixel array 10.

Figure 3:
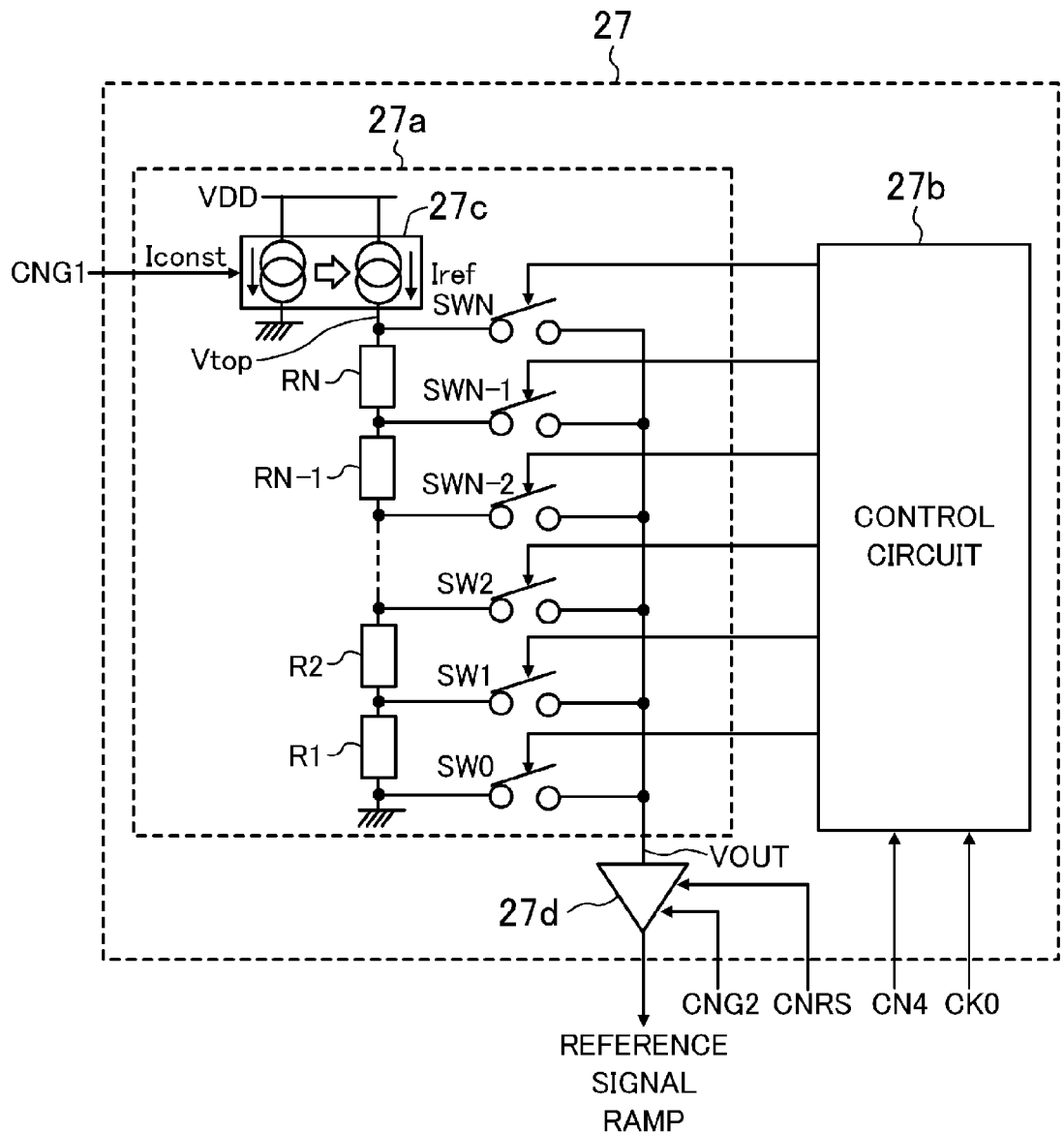
FIG. 3 is a circuit diagram showing a specific example circuit configuration of a voltage generation circuit according to the embodiment of the present disclosure.

Next, FIG. 3 is a circuit diagram showing a specific example circuit configuration of the voltage generation circuit 27 of the embodiment of the present disclosure. As described above, the voltage generation circuit 27 includes the digital-to-analog conversion circuit (DAC) 27a which converts a digital input into an analog signal, the control circuit 27b, and the attenuator 27d.

Firstly, the DAC 27a includes a current varying circuit 27c which outputs, based on the current control signal CNG1, a reference current Iref generated from a constant current Iconst, a ladder resistor circuit which receives the reference current Iref and includes a plurality of resistors R1-RN, and switches SW0-SWN which are provided between respective corresponding taps between the resistors and an output terminal of the DAC 27a. This configuration allows for generation of a plurality of voltages as top voltages Vtop of the ladder resistor circuit.

In the DAC 27a, when one of the switches SW0-SWN is turned on, one of the reference voltages is output as an output voltage. Thus, the DAC 27a generates an output voltage (the reference signal RAMP) which is an analog signal whose level is changed in a stepwise manner.

Here, since the reference signal RAMP is input to one end of each of the voltage comparators 252 in all the columns, a considerably large parasitic resistance or parasitic capacitance is added to a line which transmits the reference signal RAMP. Therefore, the reference signal RAMP whose level is changed in a stepwise manner is smoothed at the input terminal of the voltage comparator 252 to have a linear slope profile.

The control circuit 27b which controls the switches SW0-SWN receives the digital clock signal CK0, and outputs a digital control signal. The control circuit 27b selects an appropriate switch based on the control signal so that an output voltage (Vout) having a voltage value corresponding to the digital value of the digital clock signal CK0 is generated at an output node of the DAC 27a.

The gain control signals CNG1 and CNG2 are signals for setting a gain Gain1 of the DAC 27a and a gain Gain2 of the attenuator 27d, respectively.

In the solid-state imaging device of this embodiment, the attenuator 27d is provided in the voltage generation circuit 27 to attenuate the analog signal output by the DAC 27a. Therefore, as described above, noise contained in the reference signal RAMP output from the voltage generation circuit is significantly reduced compared to conventional solid-state imaging devices. Therefore, the solid-state imaging device of this embodiment can perform more accurate analog-to-digital conversion of a pixel signal, thereby providing a captured image having a higher resolution.

—Description of Circuit Operation Using Timing Chart—

Figure 4:
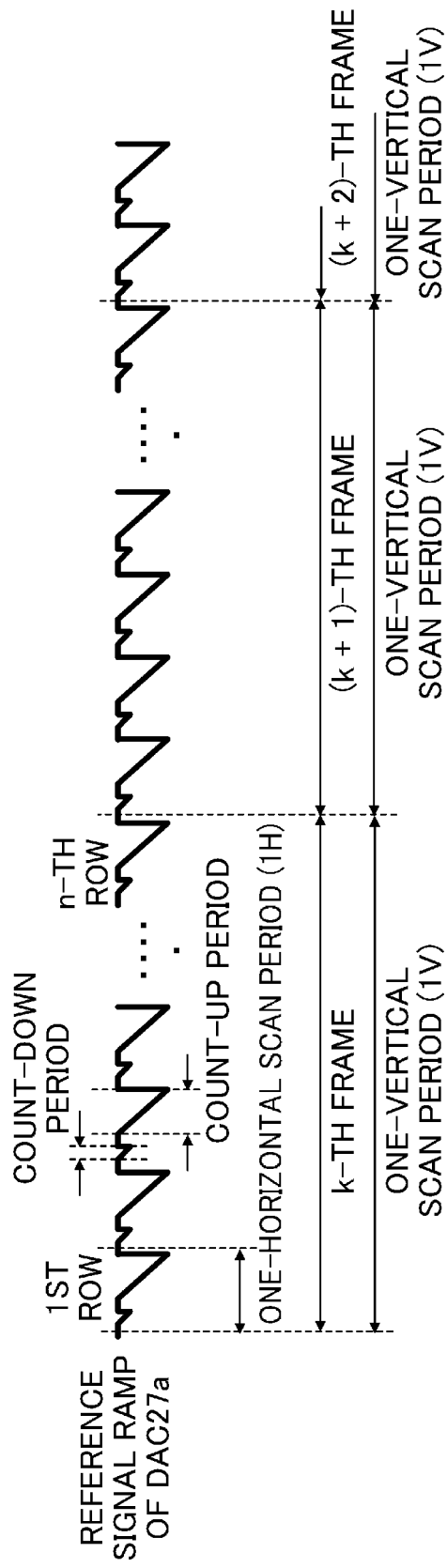
FIG. 4 is a timing chart for describing a method for driving a solid-state imaging device according to the embodiment of the present disclosure.
Figure 5:
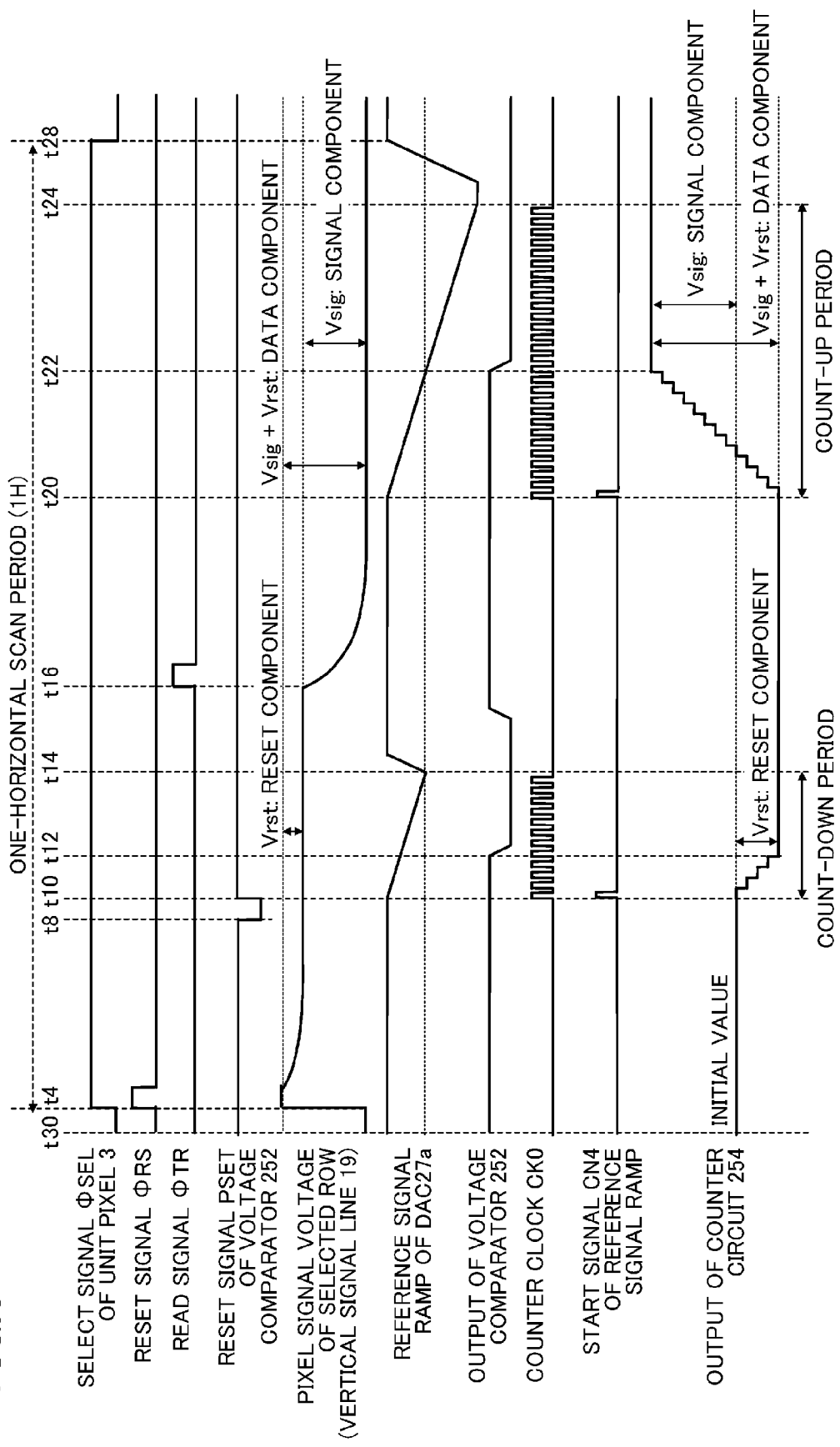
FIG. 5 is a timing chart for describing the method for driving the solid-state imaging device of the embodiment of the present disclosure.

FIGS. 4 and 5 are timing charts for describing a method for driving the solid-state imaging device of the embodiment of the present disclosure. FIG. 4 shows an operation of the solid-state imaging device of this embodiment over several frames. The column A/D conversion circuit 25 successively performs digital CDS on pixel signals from all the rows. Here, in a k-th frame, a count-down period for reading the reset component of a pixel and a count-up period for reading the signal component of a pixel are required to read pixels in each row, i.e., from the first row to the n-th row.

Thus, as shown in FIG. 4, in the solid-state imaging device of this embodiment, reading of a signal from a unit pixel 3 in each row, i.e., an A/D conversion period, includes the count-down period and the count-up period. By performing the A/D conversion period in all the rows, the video data D1 corresponding to one frame is output.

In the solid-state imaging device of this embodiment, prior to the start of this one-vertical scan period (1V), the gain control signals CNG1 and CNG2 are changed, depending on the luminance level of a subject, whereby the slope of the reference signal RAMP from the voltage generation circuit 27 can be changed. Specifically, for low illuminance, prior to the start of the one-vertical scan period (1V), the slope of the reference signal RAMP is decreased to increase the circuit gain. On the other hand, for high luminance, prior to the start of the one-vertical scan period (1V), the slope of the reference signal RAMP is increased to decrease the circuit gain.

In the conventional art, for low illuminance, noise of the switches SW0-SWN increases, and therefore, if the slope of the reference signal RAMP is decreased, noise increases. On the other hand, in the solid-state imaging device of this embodiment, the current varying circuit 27c and the attenuator 27d are provided, whereby such noise can be reduced. Therefore, by using the voltage generation circuit 27 of this embodiment, an image with less noise can be obtained even for low illuminance.

Next, timing of a one-horizontal scan period (1H) will be described.

Firstly, for reading in the first time, the timing controller 20 resets the count value of the counter 254 to a predetermined initial value, and sets the counter 254 to a count-down mode based on the control signal CN5 (see FIG. 1) from the timing controller 20. Here, the initial count value may be either "0" or an arbitrary value.

Next, in FIGS. 2 and 5, the level of the select signal line ΦSEL goes high at time t4, so that the select transistor T13 of the unit pixel 3 is turned on, and therefore, the pixel in a predetermined row is selected. At this time, the level of the read signal line ΦTR is low, and therefore, the read transistor T10 is off. Also, at this time (time t4), the level of the reset signal line ΦRS goes high, so that the reset transistor T11 is turned on, and therefore, the voltage of the floating diffusion FD of the unit pixel 3 is reset.

Next, after a predetermined period of time has passed, the level of the reset signal line ΦRS goes low while the voltage of the floating diffusion FD is reset, and therefore, the reset transistor T11 is turned off. Thereafter, the voltage of the floating diffusion FD of the unit pixel 3 is amplified by the amplification transistor T12, and the reset component (Vrst) is read through the vertical signal line 19 to the column processor 26.

At time t10, the potential of the vertical signal line 19 is read by counting down. During the counting down, the timing controller 20 supplies, to the voltage generation circuit 27, the control signal CN4 for generating the reference signal RAMP. When receiving the controls signal CN4, the voltage generation circuit 27 receives the reference signal RAMP as a comparative voltage at the input terminal (+) of the voltage comparator 252. The voltage comparator 252 compares the voltage of the reference signal RAMP with the voltage of the reset component (Vrst) of a pixel on the ADC input line 40 (ADINx) of each column.

Also, at time t10, at the same time that the reference signal RAMP is input to the input terminal (+) of the voltage comparator 252, the count clock CK0 is input from the timing controller 20 to the clock terminal of the counter 254 in synchronization with the reference signal RAMP output from the voltage generation circuit 27 in order to measure a comparative time in the voltage comparator 252 using the counter 254 provided for each column. As a result, the counter 254 starts counting down from the set initial value as the first count operation.

The voltage comparator 252 also compares the reference signal RAMP from the voltage generation circuit 27 with the voltage (Vrst) of a pixel reset component of the selected row which is input through the ADC input line 40. When the two voltages becomes equal (here, time t12), the level of the output signal is inverted from a high level to a low level. Specifically, the voltage corresponding to the reset component Vrst is compared with the reference signal RAMP to measure a magnitude in a time-axis direction corresponding to the level of the reset component Vrst by counting using the count clock CK0, whereby a count value corresponding to the level of the reset component Vrst is obtained. In other words, the counter 254 performs counting down until the output of the voltage comparator 252 is inverted, where the start time of a change in the reference signal RAMP is the start time of counting down of the counter 254, whereby the count value corresponding to the reset component Vrst is obtained.

Next, when the predetermined count-down period ends at time t14, the timing controller 20 stops the supply of control data to the voltage comparator 252 and the supply of the count clock CK0 to the counter 254. As a result, the voltage comparator 252 stops the generation of the reference signal RAMP. In this first read operation, the reset component Vrst of a pixel signal voltage in a selected row Vx is detected by the voltage comparator 252 to perform the count operation, and therefore, the reset component Vrst of the unit pixel 3 is read out.

When the A/D conversion of the pixel reset component ends, the second pixel signal read operation is then started. During this second read operation, in addition to the reset component Vrst, an operation of reading the signal component Vsig corresponding to the amount of incident light of each unit pixel 3 is performed. A difference from the first read operation is that, for the second read operation, the counter 254 is set to the count-up mode based on the control signal CN2 from the timing controller 20.

Specifically, when the level of the read signal line ΦTR goes high at time t16, so that the read transistor T10 is turned on, all photocharge accumulated in the photodiode PD1 is transmitted to the floating diffusion FD. Thereafter, when the level of the read signal line ΦTR goes low, the read transistor T10 is turned off.

At time t20, the data component (Vrst+Vsig) of the amplification transistor T12 is read through the vertical signal line 19 while the read transistor T10 is off. The potential of the vertical signal line 19 is read by counting up.

During this counting up, the timing controller 20 supplies, to the voltage generation circuit 27, the control signal CN4 for generating the reference signal RAMP. When receiving the control signal CN4, the voltage generation circuit 27 inputs the reference signal RAMP as a comparative voltage to the input terminal (+) of the voltage comparator 252. The voltage comparator 252 compares the voltage of the reference signal RAMP with the voltage of the data component (Vrst+Vsig) of a pixel on the ADC input line 40 (ADINx) of each column.

Also, at time t20, at the same time that the reference signal RAMP is input to the input terminal (+) of the voltage comparator 252, the counter 254 starts counting up from the count value which occurred when the counter 254 stopped counting down, as the second count operation.

During a count-up period from time t20 to time t24, the voltage comparator 252 compares the reference signal RAMP from the voltage generation circuit 27 with the data component (Vrst+Vsig) of a pixel signal component in a selected row Vx which is input through the ADC input line 40 of each column. When the two voltages become equal, the comparator output is inverted from the high level to the low level. In the example of FIG. 5, at time t22, the output of the voltage comparator 252 changes from the high level to the low level.

Next, at time t24, the column A/D conversion circuit 25 completes the read operation of a pixel signal read onto the vertical signal line 19, and therefore, the CDS process is also completed.

Specifically, the voltage signal corresponding to the data component (Vrst+Vsig) is compared with the reference signal RAMP to measure the magnitude in the time-axis direction corresponding to the magnitude of the signal component Vsig using the count clock CK0, whereby a count value corresponding to the magnitude of the signal component Vsig can be obtained. In other words, the counter 254 performs counting up until the output of the voltage comparator 252 is inverted, where the start time of a change in the reference signal RAMP is the start time of counting up of the counter 254, whereby the count value corresponding to the data component (Vrst+Vsig) is obtained.

Thus, in the digital CDS, for example, the counter 254 is set to counting down when the reset component (Vrst) is read out, and to counting up when the data component (Vrst+Vsig) is read out, and therefore, subtraction is automatically performed in the counter 254, whereby a count value corresponding to the signal component Vsig is obtained.

Thereafter, at time t30, the data obtained by A/D conversion is transferred to and stored in the data storage 256. In this case, the control signal CN8 which is a memory transfer instruction pulse is supplied from the timing controller 20 to the counter 254, and the result of counting a pixel signal in the previous row Vx−1 is transferred to the data storage 256.

—Noise Occurring in Voltage Generation Circuit 27—

As described above, the DAC 27a included in the voltage generation circuit 27 includes the ladder resistors R1-RN which are used to generate a plurality of voltages, and the switches SW0-SWN which correspond to the respective taps of the ladder resistors. When one of the switches SW0-SWN is turned on, one of the reference voltages is output as an output voltage. Thus, a multi-level output voltage (the reference signal RAMP) is generated.

In the voltage generation circuit 27 of such a ladder type, the number of reference voltages needs to be increased in order to increase the number of levels of the output voltage. Therefore, the number of ladder resistors included in the ladder resistor circuit and the number of switches need to be increased, leading to an increase in circuit size. For example, in order to provide 11-bit output voltages, 2048 resistors and 2048 switches are required, for example. In order to 12-bit output voltages, 4096 resistors and 4096 switches are required. Thus, as the number of levels of the output voltage is increased, the circuit size of the voltage generation circuit increases. On the other hand, the voltage generation circuit 27 requires only one current varying circuit 27c and only one attenuator 27d, each of which can be configured using a small number of elements.

Next, noise occurring in the voltage generation circuit 27 will be described in detail. Firstly, device noise is noise which occurs from each device, such as each transistor element, each resistor, etc., including thermal noise, which is white noise, 1/f noise, which depends on a frequency, etc. Moreover, device noise also includes charge injection and clock field through which occur when a switch is turned on/off.

Of noises occurring in the voltage generation circuit 27, thermal noise of a MOS transistor included in the switch is dominant. Thermal noise occurring in the ladder resistor circuit can be reduced by decreasing the resistance value of the resistor. The resistance value of the resistor can be decreased without an increase in chip area, and therefore, the thermal noise occurring in the ladder resistor circuit is reduced. However, it is difficult to decrease the thermal noise of the MOS transistor without an increase in chip area.

In general, thermal noise Vn1 per unit frequency occurring in a resistor is represented by:

$$(Vn1)^2 = 4kTR \quad (1)$$

where k is the Boltzmann constant, T is the absolute temperature, and R is the resistance value.

As can be seen from Expression (1), the thermal noise of a resistor can be reduced by decreasing the resistance value. Here, the resistance Rps of a resistor is represented by:

$$Rps = \rho \times Lps/(Wps \times T) \quad (2)$$

where $\rho$ is the resistivity of the resistor, Lps is the length of the resistor, Wps is the width of the resistor, and T is the height (thickness) of the resistor. Note that a polysilicon resistor is often used as a resistor, and therefore, "ps" is here used to indicate such a resistor.

In this case, the resistance value Rps of a resistor can be reduced by increasing the width Wps of the resistor and decreasing the length Lps of the resistor, without an increase in chip area.

On the other hand, the on resistance Ron of a MOS transistor included in a switch is represented by:

$$Ron=1/(\mu \times Cox \times (W/L) \times (Vgs-Vth)) \quad (3)$$

where L is the gate length, W is the gate width, μ is the mobility, and Cox is the gate oxide film capacitance.

Here, in recent circuits, Vgs has decreased as the power supply voltage has been reduced. In order to decrease the on resistance Ron of a MOS transistor, depending on the output voltage, it is necessary to use both an NMOS transistor and a PMOS transistor. Moreover, if the gate length L is decreased, Ron decreases, but problems with the MOS transistor arise, such as an increase in off leakage, an increase in variations, etc. As can be seen from these points, for a MOS transistor included in a switch, it is not easy to decrease the on resistance Ron of the MOS transistor in order to reduce thermal noise, and the reduction in the on resistance Ron leads to a significant increase in chip area.

—Mechanism of Occurrence of Noise of Voltage Generation Circuit 27 as Random Horizontal Noise—

Next, a mechanism that noise which is superposed on the reference signal RAMP which is an output signal of the voltage generation circuit 27, occurs as random horizontal noise, will be described.

As described above, the A/D conversion means of this embodiment includes the voltage generation circuit 27 which generates the reference signal RAMP which changes in time at a predetermined change rate to have a slope profile, and the voltage comparators 252 which are provided, one for each column. The voltage value of the reference signal RAMP monotonically linearly increases or decreases to have a slope profile during a predetermined period of time.

As described above with reference to the timing chart, the voltage comparator 252 compares an analog signal on the vertical signal line 19 with the reference signal RAMP. The analog signal on the vertical signal line 19 is converted into the time-axis direction for each column, and the time is measured, whereby the analog signal on the vertical signal line 19 is converted into a digital signal.

The noise component of the reference signal RAMP is simply represented by:

$$\Delta N = \sqrt{\{(\Delta N1)^2 + (\Delta N2)^2\}} \quad (4)$$

where ΔN1 is a noise component which is superposed on the reference signal RAMP as soon as the first read operation of the reset component (Vrst) is performed, and ΔN2 is a noise component which is superposed on the reference signal RAMP as soon as the second read operation of the data component (the reset component Vrst+the signal component Vsig) is performed.

Therefore, this noise is superposed on the signal which is obtained by A/D conversion. In a scheme in which all the columns are simultaneously processed in parallel, this noise component is superposed on output signals of all the columns which are obtained by A/D conversion at a certain time, and therefore, a phenomenon as random horizontal noise occurs. Next, this random horizontal noise will be quantitatively described.

—Relationship Between CDS and Noise—

A main purpose of digital CDS is to remove voltage components (1/f noise etc.) in a relatively low frequency region including a DC component, of noise components. Here, noise which occurs as random horizontal noise in a DAC will be quantitatively described.

Firstly, CDS will be described with reference to the timing chart of FIG. 5. The column A/D conversion circuit 25 plays a role in calculating the signal component Vsig of the unit pixel 3 using a voltage difference between the reset component (Vrst) previously read out and the data component (the reset component Vrst+the signal component Vsig) subsequently read out.

Qualitatively speaking, for noise having a lower frequency than the frequency fs of digital CDS (the reciprocal of a CDS period T (=time t22–time t12) which is a time difference between when the reset component is read out and when the data component is read out), the reset component Vrst is equal to a noise voltage contained in the subsequently read data component (the reset component Vrst+the signal component Vsig), so that the noise voltage difference is zero, whereby noise can be removed by digital CDS.

On the other hand, for noise having a relatively high frequency, there is a difference in level between time t22 and time t12, i.e., the noise voltage difference is not zero, and therefore, noise cannot be removed by digital CDS.

Specifically, the transfer function H(f) of CDS is represented by:

$$H(f)=1-\exp(-j2\pi f\tau) \quad (5)$$

where j is the imaginary unit, and τ is the CDS period which is 1/fs. The square of the absolute value of H(f), which is $|H(f)|^2$, is represented by:

$$|H(f)|^2 = 2 \cdot (1-\cos(2\pi f\tau)) \quad (6)$$

As can be seen from Expression (6), qualitatively speaking, a signal or noise having the frequency f lower than the frequency fs (=1/τ) of CDS is $|H(f)|^2 \approx 0$, i.e., is attenuated.

As described above, digital CDS is effective to attenuate 1/f noise in a relatively low frequency region. However, a noise component having a high frequency cannot be removed by CDS, and conversely, thermal noise deteriorates by a factor of √2, so that noise is superposed in all the columns. As a result, the noise is easily visually noticeable as random horizontal noise.

In general, random noise is difficult to visually recognize, while random horizontal noise is easy to visually recognize. Therefore, specifically, random horizontal noise needs to be reduced to a level which is about 1/10 of the level of random noise.

—Random Horizontal Noise Reducing Effect of Voltage Generation Circuit 27 of this Embodiment—

Next, the voltage generation circuit 27 which includes the attenuator 27d in order to solve the horizontal noise problem will be described. Firstly, for the voltage generation circuit 27 of the embodiment of the present disclosure, S/N is calculated. Here, current noise from the current varying circuit 27c can be easily reduced by providing a low-pass filter for removing noise or decreasing the transconductance Gm of a current source, and therefore, the contribution of the current noise can be ignored.

FIG. 6A is a diagram showing the reference signal RAMP which is obtained when an inverting attenuator is used in the current varying circuit of the embodiment of the present disclosure. FIG. 6B is a diagram showing the reference signal RAMP which is obtained when a non-inverting attenuator is used.

Firstly, as shown in FIG. 6A, when the voltage generation circuit 27 includes the attenuator 27d of the inverting type, switches SWn are selected in an order which is previously set by the control circuit 27b, for example, sequentially one by one from the switch SW0 to the switch SWN. Here, a reference character 51 indicates the output signal Vout of the DAC 27a where Gain1=1 and Gain2=1. A reference character 52 indicates the output signal Vout of the DAC 27a where Gain2=1. The reference signal RAMP is the output signal of the attenuator 27d.

Conversely, as shown in FIG. 6B, when the voltage generation circuit 27 includes the attenuator 27d of the non-inverting type, switches SWn are selected in an order which is previously set by the control circuit 27b, for example, sequentially one by one from the switch SWN to the switch SW0. Here, a reference character 53 indicates the output signal Vout of the DAC 27a where Gain1=1 and Gain2=1. A reference character 54 indicates the output signal Vout of the DAC 27a where Gain2=1. The reference signal RAMP is the output signal of the attenuator 27d.

In this case, assuming that a selected switch SWn is an M-th switch, counted from the reference potential (GND), the signal component S of the reference signal RAMP is represented by:

$$S=(V_{const} \times Gain1)/R_{tot} \times R_{unit} \times M \times Gain2 = I_{const} \times Gain1 \times R_{unit} \times M \times Gain2 \quad (7)$$

where Rtot is the total resistance value of the ladder resistor circuit, and Runit is the resistance value of a single ladder resistor. Gain1 is the mirror ratio of the current varying circuit 27c and is represented by Gain1=Iref/Iconst. Also, Vconst=Iconst×Rtot. In this case, the voltage Vtop at the maximum node of the ladder resistor circuit is represented by Vtop=Iref×Rtot=(Iconst×Gain1)×Rtot=Vconst×Gain1.

Since the attenuator 27d is a circuit for attenuating the output voltage, Gain2 is one or less.

On the other hand, as described above, in a noise component N of the reference signal RAMP, a noise component Nsw of a selected one of the switches SW0-SWN is dominant. Therefore, the noise component N is represented by:

$$N = N_{sw} \times Gain2 \quad (8)$$

Therefore, according to Expressions (7) and (8), the output S/N is represented by:

$$S/N = (I_{const} \times Gain1 \times R_{unit} \times M)/N_{sw} \quad (9)$$

$$= (I_{const} \times R_{unit} \times M)/(N_{sw}/Gain1)$$

As can be seen from this result, by providing the current varying circuit 27c and the attenuator 27d, the noise Nsw of a switch is reduced by a factor of the gain (Gain1) of the current varying circuit 27c.

Thus, in the voltage generation circuit 27 of this embodiment, noise occurring in the switch can be reduced by providing the attenuator 27d. Therefore, when the voltage generation circuit 27 of this embodiment is used in a solid-state imaging device, random horizontal noise can be effectively reduced. Also, only one attenuator 27d may be required in the voltage generation circuit 27, and the attenuator 27d has a relatively simple configuration, and therefore, the circuit area does not significantly increase. Therefore, a high-quality captured image can be obtained.

—Example Circuit Configuration of Attenuator 27d—

Next, an example configuration of the attenuator 27d will be described. Various types of attenuators are commonly known, including the active type and the passive type, or the resistive voltage divider type, which uses resistors to set the attenuation ratio, and a capacitive voltage divider type, which uses capacitors.

In general, thermal noise occurs in resistive voltage divider type attenuators, which use resistors, while noise does not occur in capacitive voltage divider type attenuators, which use capacitors. Therefore, capacitive voltage divider type attenuators are preferable, although resistive voltage divider attenuators may be employed. Therefore, the attenuator 27d of the active or passive type which includes capacitors will be described as one which is used in the voltage generation circuit 27 of this embodiment.

Figure 7:
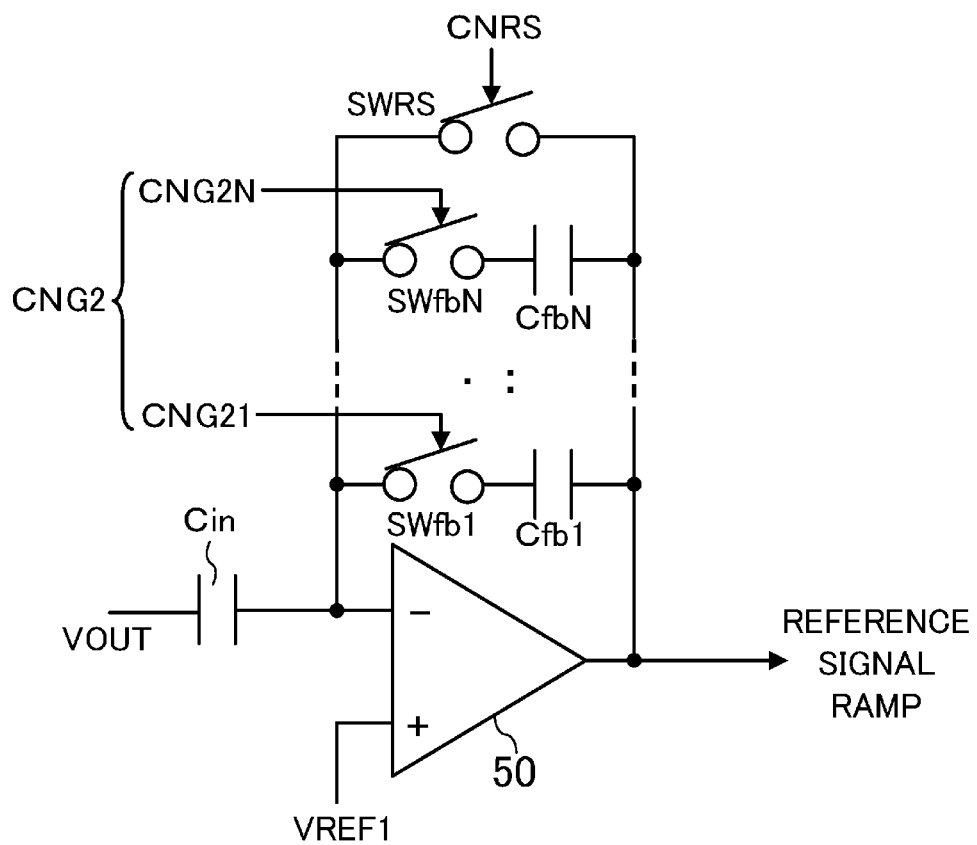
FIG. 7 is a circuit diagram showing an example active type attenuator which includes a differential amplifier.

FIG. 7 is a circuit diagram showing an example active type attenuator which includes a differential amplifier. The attenuator 27d of FIG. 7 includes an input capacitor Cin which is connected to the switches SW0-SWN, a differential amplifier 50 which has an input terminal (−) connected to one end of the input capacitor Cin and an input terminal (+) held at a reference voltage VREF1, a plurality of feedback capacitors Cfb1-CfbN which are provided between an output terminal and the input terminal (−) of the differential amplifier 50 and are arranged in parallel to each other, a plurality of switches SWFb1-SWFbN which are provided between the respective corresponding feedback capacitors Cfb1-CfbN and the input terminal (−) of the differential amplifier 50, and a switch SWRS which is used to connect the input terminal (−) of the differential amplifier 50 and the output terminal without the feedback capacitors Cfb1-CfbN.

The switches SWFb1-SWFbN are controlled based on the respective corresponding gain control signals CNG2 (CNG21-CNG2N). The switch SWRS is controlled based on the control signal CNRS.

In the attenuator 27d thus configured, the attenuation ratio is determined by the capacitance ratio of the input capacitor Cin and one or more feedback capacitors Cfbk ($1 \leq k \leq N$) selected based on the gain control signal CNG2. The input terminal and the output terminal are connected together via the switch SWRS based on the control signal CNRS only during resetting. Here, the attenuation ratio Gain2 is represented by:

$$Gain2 = Cin/Cfbk \quad (10)$$

In the attenuator 27d of this type, the reference signal RAMP, which is the output signal, is an inversion of the input signal VOUT.

Figure 8:
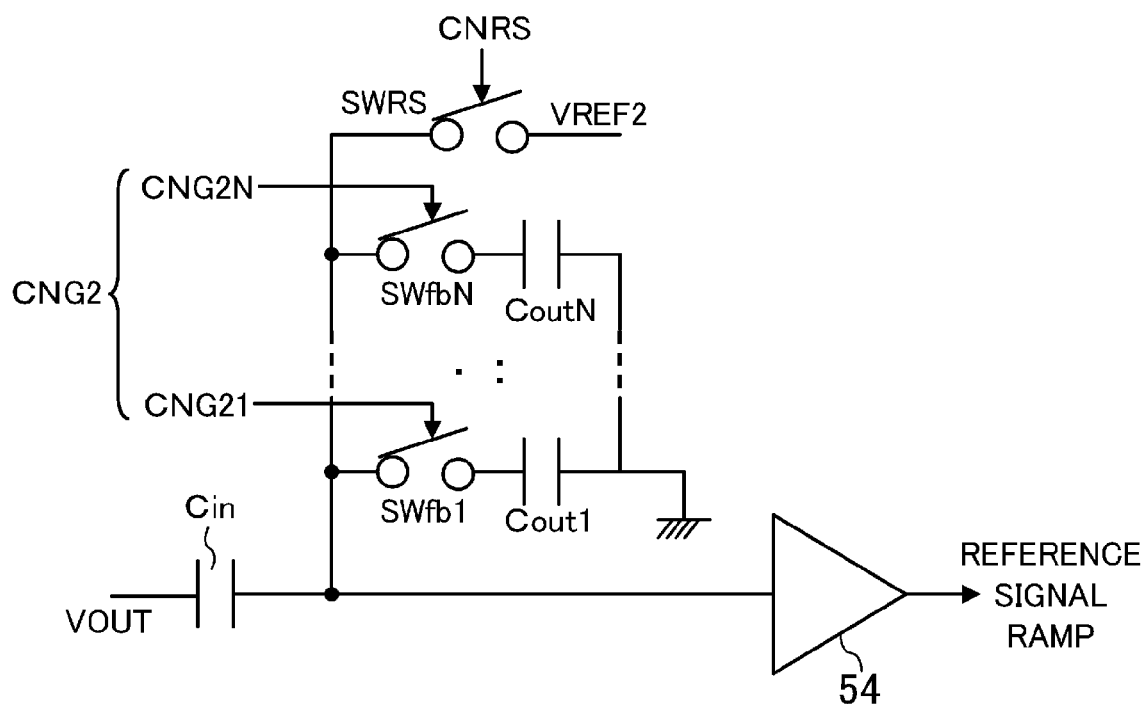
FIG. 8 is a circuit diagram showing an example passive type attenuator which does not include a differential amplifier.

FIG. 8 is a circuit diagram showing an example passive type attenuator which does not include a differential amplifier. The attenuator 27d of FIG. 8 includes an input capacitor Cin which is connected to a plurality of switches SW0-SWN, a buffer circuit 54 which is connected to one end of the input capacitor Cin, capacitors Cout1-CoutN which are provided between a node between the input capacitor Cin and an input terminal of the buffer circuit 54, and the ground, and are arranged in parallel to each other, a plurality of switches SWFb1-SWFbN which are provided between the input terminal of the buffer circuit 54 and the respective corresponding capacitors Cout1-CoutN, and a switch SWRS which is connected to the node between the input capacitor Cin and the input terminal of the buffer circuit 54.

The switches SWFb1-SWFbN are controlled based on the respective corresponding gain control signals CNG2 (CNG21-CNG2N). The switch SWRS is controlled based on the control signal CNRS. Both of the control signals CNG2 and CNRS are digital signals output from the control circuit 27b.

In the attenuator 27d thus configured, the attenuation ratio is determined by the capacitance ratio of the input capacitor Cin and one or more output capacitors Coutk (1≤k≤N) selected based on the gain control signal CNG2 output from the timing controller 20. In other words, the attenuator 27d can be set to a plurality of attenuation ratios based on the gain control signal CNG2.

A reference voltage VREF2 is applied via the switch SWRS to the input terminal of the buffer circuit 54 only during resetting. Here, the attenuation ratio Gain2 is represented by:

$$\text{Gain2} = Cin/(Cin + Coutk) \qquad (11)$$

In the attenuator 27d of this type, the reference signal RAMP, which is the output signal, is not an inversion of the input signal VOUT (the output signal of the DAC 27a), i.e., is a non-inversion. Here, the reference signal RAMP is supplied to the input terminals of the voltage comparators 252 in all the columns, and therefore, a significantly large parasitic capacitance is added to lines for supplying the reference signal RAMP. Therefore, as can be seen from Expression (11), if the attenuator 27d does not include a buffer circuit, Cout increases, so that Gain2 is affected by the parasitic capacitances. Therefore, in order to reduce or avoid the influence of the parasitic capacitances, the attenuator 27d preferably includes the buffer circuit 54.

If the configuration of the attenuator 27d becomes complicated, so that the number of elements increases, it is likely that there are more noise sources, resulting in an increase in noise. Conversely, if an attempt is made to reduce noise in this situation, the device size increases, leading to an increase in chip area. Therefore, it is desirable that the attenuator 27d preferably include a smaller number of elements and operate at a higher speed. This type has a circuit configuration which addresses such a problem.

—Adjustment of Slope of Reference Signal RAMP and Linkage Between Gain1 and Gain2—

As described above with reference to the timing chart, in this type, the voltage comparator 252 compares the analog signal of the vertical signal line 19 with the reference signal RAMP to convert the analog signal of the vertical signal line 19 into a time-axis direction on a column-by-column basis. By measuring this time, the analog signal read from the vertical signal line 19 is converted into a digital signal.

Therefore, by changing the slope of the reference signal RAMP, digital data which is a result of adjustment of the gain of the analog signal can be obtained. For example, if the slope of the reference signal RAMP is decreased, the count value increases, which is equivalent to amplification of a pixel signal.

The slope of the reference signal RAMP can be changed based on the Gain1 of the current varying circuit 27c and the Gain2 of the attenuator 27d. As indicated by Expression (9), in terms of noise of the voltage generation circuit 27, it is preferable to decrease Gain2 while increasing Gain1 to the extent possible.

However, it is desirable that while Gain1 of the current varying circuit 27c can be easily finely adjusted based on the current mirror ratio, as described above the attenuator 27d be configured using a smaller number of elements, resulting in less noise and high-speed operation. Therefore, in order to change the slope of the reference signal RAMP, the control step width of the gain is preferably finely adjusted using the current varying circuit 27c, and is preferably roughly adjusted using the attenuator 27d.

As described above, the voltage generation circuit 27 of the embodiment of the present disclosure includes the ladder resistor circuit which receives a reference current to generate a plurality of voltages, the DAC 27a which includes the switches SW0-SWN provided between the respective corresponding taps of the ladder resistor circuit and the input terminal of the attenuator 27d, and the attenuator 27d which is connected to the output terminal of the DAC 27a and outputs the reference signal RAMP.

This configuration allows for an improvement in random horizontal noise characteristics while reducing or preventing an increase in chip area. By using a solid-state imaging device including the voltage generation circuit of this embodiment, a high-quality image can be captured with reduced random horizontal noise and without an increase in device size.

—Variation of Voltage Generation Circuit of Embodiment of Present Disclosure—

Figure 9:
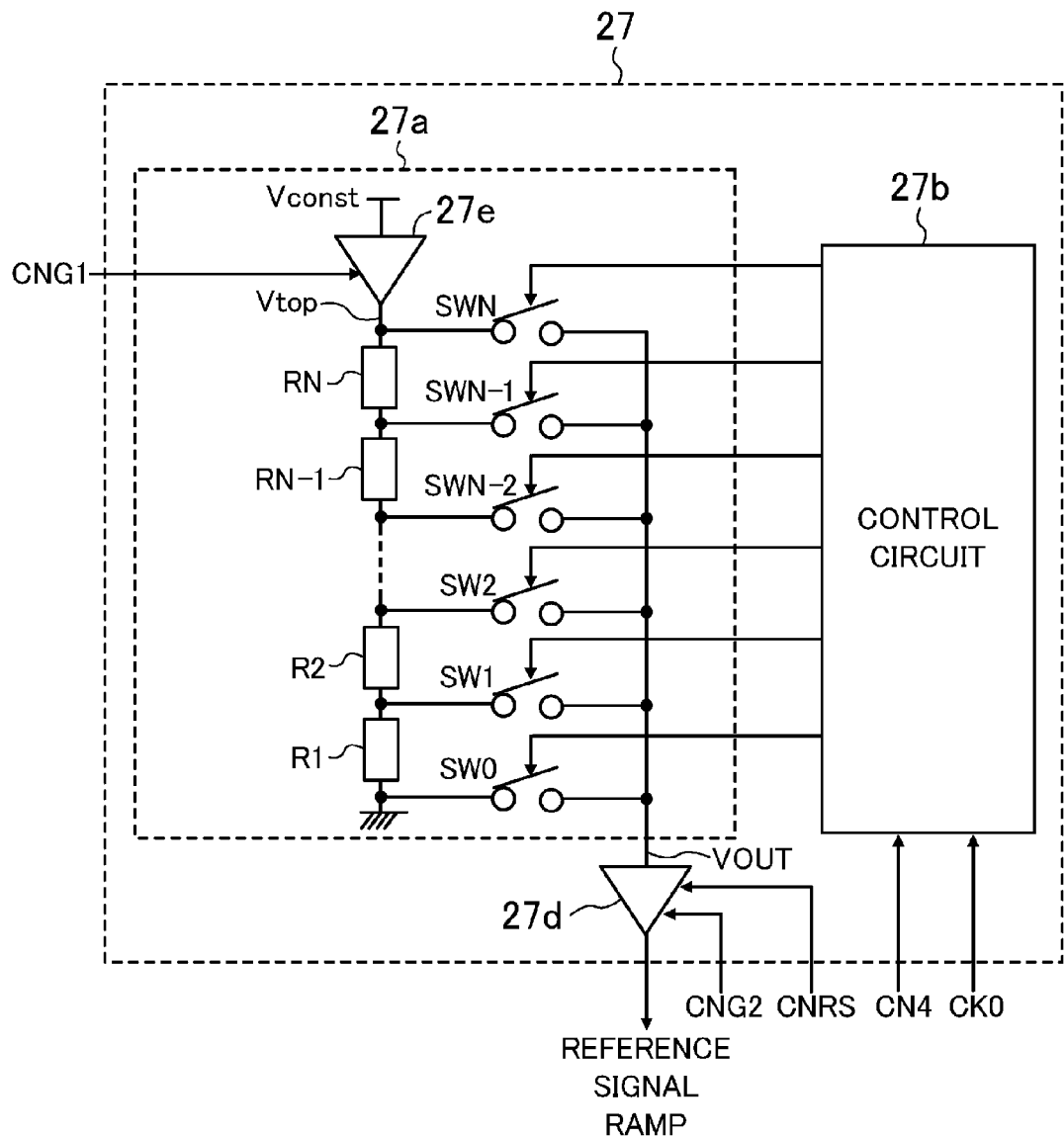
FIG. 9 is a circuit diagram showing a specific example circuit configuration of a voltage generation circuit according to a variation of the embodiment of the present disclosure.
Figure 10:
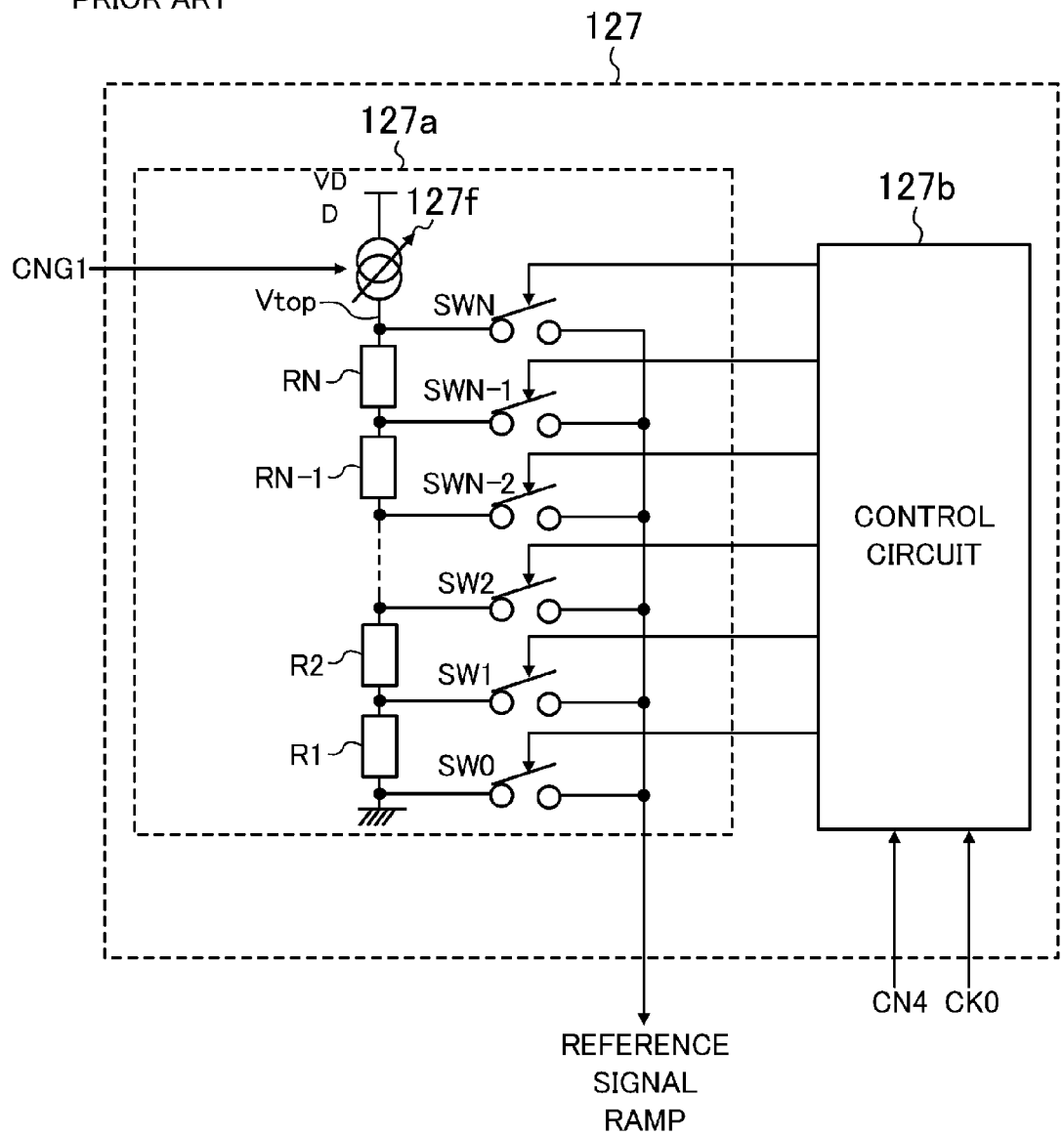
FIG. 10 is a circuit diagram showing a conventional voltage generation circuit.

FIG. 9 is a circuit diagram showing a specific example circuit configuration of a voltage generation circuit 27 according to a variation of the embodiment of the present disclosure. As with the voltage generation circuit 27 of FIG. 3, the voltage generation circuit 27 of this variation includes a DAC 27a, a control circuit 27b, and an attenuator 27d.

Firstly, the DAC 27a includes a voltage varying circuit 27e which generates a reference voltage from a constant voltage Vconst based on a current control signal CNG1, a ladder resistor circuit which receives the reference voltage and includes a plurality of resistors R1-RN, and a plurality of switches SW0-SWN which are connected to respective corresponding taps between the resistors. With this configuration, a plurality of voltages can be generated as top voltages Vtop of the ladder resistor circuit.

In the DAC 27a, when one of the switches SW0-SWN is turned on, one of the reference voltages is output as an output voltage. Thus, the DAC 27a generates an output voltage (a reference signal RAMP) which is an analog signal whose level is changed in a stepwise manner.

The control circuit 27b which controls the switches SW0-SWN receives a digital clock signal CK0, and outputs a digital control signal. The control circuit 27b selects an appropriate switch based on the control signal so that an output voltage (Vout) having a voltage value corresponding to the digital value of the digital clock signal CK0 is generated at an output node of the DAC 27a. This configuration also simultaneously allows for a high-speed read operation and an improvement in noise characteristics while reducing or preventing an increase in chip area.

Next, a solid-state imaging device according to this variation and a method for driving the solid-state imaging device will be described. An imaging apparatus and the solid-state imaging device according to this variation have configurations similar to those of FIG. 1.

The solid-state imaging device of this variation has the same timing chart as that of this embodiment of FIGS. 4 and 5. The attenuator 27d of FIGS. 7 and 8 is also used in the voltage generation circuit 27 of this variation.

As shown in FIG. 9, the voltage generation circuit 27 of this variation is different from the voltage generation circuit 27 of FIG. 3 in that the ladder resistor circuit receives a predetermined voltage instead of a predetermined current. The rest of the configuration is similar to that of the voltage generation circuit 27 of FIG. 3.

The output S/N of the voltage generation circuit 27 of this variation is calculated as follows.

Firstly, as shown in FIG. 6A, when the attenuator 27d of the inverting type is used, switches SWn are selected and turned on in an order which is previously set by the control circuit 27b, for example, sequentially one by one from the switch SW0 to the switch SWN. A reference character 51 indicates the output signal Vout of the DAC 27a where Gain1=1 and Gain2=1. A reference character 52 indicates the output signal Vout of the DAC 27a where Gain2=1. The reference signal RAMP is an output signal of the attenuator 27d.

Conversely, as shown in FIG. 6B, when the attenuator 27d of the non-inverting type is used, switches SWn are selected and turned on in an order which is previously set by the control circuit 27b, for example, sequentially one by one from the switch SWN to the switch SW0. Here, a reference character 53 indicates the output signal Vout of the DAC 27a where Gain1=1 and Gain2=1. A reference character 54 indicates the output signal Vout of the DAC 27a where Gain2=1. The reference signal RAMP is an output signal of the attenuator 27d.

In this case, if the selected switch SWn is an M-th switch, counted from the reference potential (GND), the signal component S of the reference signal RAMP is represented by:

$$S = (Vconst \times Gain1)/Rtot \times Runit \times M \times Gain2 \quad (12)$$
$$= Iconst \times Gain1 \times Runit \times M \times Gain2$$

where Rtot is the total resistance value of the ladder resistor circuit, and Runit is the resistance value of a single ladder resistor. Gain1 is the gain ratio of the voltage varying circuit 27e and is represented by Gain1=Vtop/Vconst. Also, Vconst=Iconst×Rtot. In this case, the voltage Vtop at the maximum node of the ladder resistor circuit is represented by Vtop=Vconst×Gain1=(Iconst×Rtot)×Gain1.

Since the attenuator 27d is a circuit for attenuating the output voltage, Gain2 is one or less.

On the other hand, as described above, in a noise component N of the reference signal RAMP, a noise component Nsw of a selected one of the switches SW0-SWN is dominant. Therefore, the noise component N is represented by:

$$N = Nsw \times Gain2 \quad (13)$$

Therefore, according to Expressions (12) and (13), the output S/N is represented by:

$$S/N = (Iconst \times Gain1 \times Runit \times M)/Nsw \quad (14)$$
$$= (Iconst \times Runit \times M)/(Nsw/Gain1)$$

As can be seen from this result, by providing the voltage varying circuit 27e and the attenuator 27d, the noise Nsw of a switch is reduced by a factor of the gain (Gain1) of the voltage varying circuit 27e.

Thus, in the voltage generation circuit 27 of this variation, noise occurring in the switch can be reduced by providing the attenuator 27d. Therefore, when the voltage generation circuit 27 of this variation is used in a solid-state imaging device, random horizontal noise can be effectively reduced. Also, only one attenuator 27d may be required in the voltage generation circuit 27, and the attenuator 27d has a relatively simple configuration, and therefore, the circuit area does not significantly increase. Therefore, a high-quality captured image can be obtained.

As described above, the voltage generation circuit 27 of this variation includes the ladder resistor circuit which receives a reference voltage to generate a plurality of voltages, the DAC 27a which includes the switches SW0-SWN provided between the respective corresponding taps of the ladder resistor circuit and the input terminal of the attenuator 27d, and the attenuator 27d which is connected to the output terminal of the DAC 27a and outputs the reference signal RAMP.

This configuration allows for an improvement in random horizontal noise characteristics while reducing or preventing an increase in chip area.

Note that the present disclosure is not limited to the above embodiment or its variation. Various changes and modifications may be made without departing the scope and spirit of the present disclosure.

For example, the unit pixel 3 of FIG. 2 included in the pixel array 10 includes a pixel, a transfer transistor, an FD, a reset transistor, and an amplification transistor, i.e., a so-called one-pixel-per-cell structure. Alternatively, the unit pixel 3 may have a multiple-pixels-per-cell structure in which a plurality of pixels (photodiodes) are provided in one cell, and any or all of the floating diffusion FD, the reset transistor, and the amplification transistor are shared in the unit cell.

In the present disclosure, in the A/D conversion configuration, the counter 254 is provided in the column processor 26, and the reset component (Vrst) and the data component (Vrst+Vsig) are read out by counting down and counting up, respectively. Alternatively, the reset component and the data component may be read out and subjected to A/D conversion, whereby a similar effect can be obtained.

In the above embodiment, the voltage generation circuit 27 is a ladder resistor circuit which receives a reference current or a reference voltage to generate a plurality of voltages. Alternatively, the voltage generation circuit may be a current varying type voltage generation circuit, a switched capacitor filter (SCF), etc. which exhibit an effect similar to the above effect. Also in this case, random horizontal noise characteristics can be improved.

Note that the solid-state imaging device of the present disclosure is not limited to the above embodiment or its variation. Various changes contemplated by those skilled in the art can be made to the embodiment and its variation without departing the scope and spirit of the present disclosure, and the resulting variations and various apparatuses including the solid-state imaging device of the present disclosure are encompassed by the present disclosure.

The present disclosure is applicable to a MOS solid-state imaging device, a digital still cameras, a camcorder, a mobile telephone with a camera, a surveillance camera, etc.

What is claimed is:

1. A voltage generation circuit comprising:
   a control circuit configured to output a first digital signal;
   a digital-to-analog conversion circuit configured to output a first analog signal corresponding to the first digital signal input from the control circuit; and
   an attenuator connected to an output terminal of the digital-to-analog conversion circuit, and configured to output a voltage signal obtained by attenuating the first analog signal input from the digital-to-analog conversion circuit, wherein
   the attenuator is a passive type attenuator,
   the attenuator includes:
      a second input capacitor including a third electrode and a fourth electrode,
      a buffer circuit connected to the third electrode,
      a plurality of output capacitors provided between a node between an input terminal of the buffer circuit and the third electrode, and the ground, and arranged in parallel to each other, and
      a plurality of third switches each provided between a corresponding one of the plurality of output capacitors and the input terminal of the buffer circuit, the first analog signal input from the fourth electrode is attenuated and output as the voltage signal from an output terminal of the buffer circuit, and an attenuation ratio of the first analog signal is determined based on a capacitance ratio of the second input capacitor and a selected one of the plurality of output capacitors.

2. The voltage generation circuit of claim 1, wherein
the digital-to-analog conversion circuit includes a ladder resistor circuit including a plurality of resistors, and configured to receive a reference current or a first reference voltage to generate a voltage corresponding to the first digital signal input from the control circuit, and a plurality of first switches provided between respective corresponding taps provided between the plurality of resistors, and the output terminal of the digital-to-analog conversion circuit, and configured to be controlled based on the first digital signal, and during operation, the plurality of first switches are turned on or off in an order previously set by the control circuit so that the voltage signal is output from the attenuator.

3. The voltage generation circuit of claim 2, wherein the digital-to-analog conversion circuit further includes a current varying circuit configured to supply, to the ladder resistor circuit, the reference current generated from a constant current.

4. The voltage generation circuit of claim 2, wherein the digital-to-analog conversion circuit further includes a voltage varying circuit configured to supply, to the ladder resistor circuit, the first reference voltage generated from a constant voltage.

5. The voltage generation circuit of claim 1, wherein the attenuator receives a control signal to set a plurality of attenuation ratios.

6. The voltage generation circuit of claim 2, wherein the voltage signal is adjusted by controlling the reference current or the first reference voltage, and by controlling an attenuation ratio of the attenuator.

7. The voltage generation circuit of claim 6, wherein
the voltage signal is adjusted based on the attenuation ratio of the attenuator, and
the voltage signal is more finely adjusted by controlling the reference current or the first reference voltage than when adjusted based on the attenuation ratio of the attenuator.

8. The voltage generation circuit of claim 2, wherein the control circuit controls, during a predetermined period of time, the on/off states of the plurality of first switches so that a voltage value of the voltage signal linearly decreases or increases in synchronization with a clock signal.

9. The voltage generation circuit of claim 1, wherein the attenuator is an active type attenuator including a differential amplifier.

10. A voltage generation circuit comprising:
a control circuit configured to output a first digital signal;
a digital-to-analog conversion circuit configured to output a first analog signal corresponding to the first digital signal input from the control circuit; and
an attenuator connected to an output terminal of the digital-to-analog conversion circuit, and configured to output a voltage signal obtained by attenuating the first analog signal input from the digital-to-analog conversion circuit, wherein
the attenuator is an active type attenuator including a differential amplifier,
the attenuator includes:
a first input capacitor including a first electrode and a second electrode, the differential amplifier including an inverting input terminal connected to the first electrode and a non-inverting input terminal held at a second reference voltage,
a plurality of feedback capacitors provided between a node between the inverting input terminal and the first electrode, and an output terminal of the differential amplifier, and arranged in parallel to each other, and
a plurality of second switches each provided between a corresponding one of the plurality of feedback capacitors and the inverting input terminal and between the output terminal of the differential amplifier and the inverting input terminal,
the first analog signal input from the second electrode is attenuated and output as the voltage signal from the output terminal of the differential amplifier, and
an attenuation ratio of the first analog signal is determined based on a capacitance ratio of the first input capacitor and each of the plurality of feedback capacitors.

11. The voltage generation circuit of claim 2, wherein the plurality of first switches each include a MOS transistor.

12. An analog-to-digital conversion circuit for converting an analog pixel signal read from a pixel array into a digital signal, comprising:
a voltage comparator configured to compare a voltage of the analog pixel signal with a voltage of the voltage signal output from the voltage generation circuit, wherein
the voltage generation circuit comprises:
a control circuit configured to output a first digital signal;
a digital-to-analog conversion circuit configured to output a first analog signal corresponding to the first digital signal input from the control circuit; and
an attenuator connected to an output terminal of the digital-to-analog conversion circuit, and configured to output a voltage signal obtained by attenuating the first analog signal input from the digital-to-analog conversion circuit, and
a counter configured to perform counting-up or counting-down in synchronization with a clock signal, receive a result of comparison performed by the voltage comparator, and output, as the digital signal, a count value occurring when the order of magnitude of the voltage signal and the analog pixel signal is reversed.

13. A solid-state imaging device comprising:
a pixel array including a plurality of unit pixels arranged in a matrix;
a voltage generation circuit configured to output a reference signal; and
column analog-to-digital conversion circuits provided, one for each row of the unit pixels or each group of several rows of the unit pixels, and configured to compare a voltage of an analog pixel signal read from the pixel array with a voltage of the reference signal to convert the pixel signal into a digital signal,
wherein the voltage generation circuit includes:
a control circuit configured to output a digital signal,
a digital-to-analog conversion circuit configured to output an analog signal corresponding to the digital signal input from the control circuit, and
an attenuator connected to an output terminal of the digital-to-analog conversion circuit, and configured to output, as the reference signal, a voltage signal obtained by attenuating the analog signal input from the digital-to-analog conversion circuit.

14. The solid-state imaging device of claim 13, wherein the voltage generation circuit supplies, to each of the column analog-to-digital conversion circuits, the reference signal having a voltage value which linearly increases or decreases in synchronization with a clock signal.

15. The solid-state imaging device of claim 14, wherein each of the column analog-to-digital conversion circuits includes:
- a voltage comparator configured to compare the voltage of the pixel signal with the voltage of the reference signal, and
- a counter configured to perform counting-up or counting-down in synchronization with the clock signal, receive a result of comparison performed by the voltage comparator, and output, as a digital value of the pixel signal, a count value occurring when the order of magnitude of the reference signal and the pixel signal is reversed, and
- a voltage value of the reference signal linearly increases or decreases while the counter performs counting-up or counting-down.

16. The solid-state imaging device of claim 13, wherein the digital-to-analog conversion circuit includes:
- a ladder resistor circuit including a plurality of resistors, and configured to receive a reference current or a reference voltage to generate a voltage corresponding to the digital signal input from the control circuit, and
- a plurality of switches provided between respective corresponding taps provided between the plurality of resistors, and the output terminal of the digital-to-analog conversion circuit, and configured to be controlled based on the digital signal, and
- during operation, the plurality of switches are turned on or off in an order previously set by the control circuit so that the reference signal is output from the attenuator.

17. An imaging apparatus comprising: the solid-state imaging device of claim 13.

* * * * *